United States Patent
Karda et al.

(10) Patent No.: US 10,062,426 B2
(45) Date of Patent: Aug. 28, 2018

(54) FIELD EFFECT TRANSISTOR CONSTRUCTIONS WITH GATE INSULATOR HAVING LOCAL REGIONS RADIALLY THERE-THROUGH THAT HAVE DIFFERENT CAPACITANCE AT DIFFERENT CIRCUMFERENTIAL LOCATIONS RELATIVE TO A CHANNEL CORE PERIPHERY

(71) Applicant: Micron Technology, Inc., Boise, ID (US)

(72) Inventors: Kamal M. Karda, Boise, ID (US); Chandra Mouli, Boise, ID (US); Durai Vishak Nirmal Ramaswamy, Boise, ID (US); F. Daniel Gealy, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 71 days.

(21) Appl. No.: 14/260,940

(22) Filed: Apr. 24, 2014

(65) Prior Publication Data

US 2015/0310905 A1    Oct. 29, 2015

(51) Int. Cl.
*H01L 29/423* (2006.01)
*H01L 29/78* (2006.01)
(Continued)

(52) U.S. Cl.
CPC ........ *G11C 11/223* (2013.01); *G11C 11/2275* (2013.01); *G11C 16/0466* (2013.01);
(Continued)

(58) Field of Classification Search
CPC . G11C 11/56; G11C 11/223; H01L 29/42392; H01L 29/516; H01L 29/66833;
(Continued)

(56) References Cited

U.S. PATENT DOCUMENTS 6,225,669 B1* 5/2001 Long et al. ....... H01L 21/28105
257/221
6,881,994 B2* 4/2005 Lee et al. ........... G11C 16/3427
257/296

(Continued)

FOREIGN PATENT DOCUMENTS

JP      2011-029503        7/2015
WO  PCT/US2015/027566     7/2015
WO  PCT/US2015/027566    10/2016

OTHER PUBLICATIONS

Ferroelectric Memory Devices—How to store the information of the furture?; R. S. Lous; Top Master Programme in Nanoscience; Jul. 2011; 23 pp.

(Continued)

*Primary Examiner* — Marcos D Pizarro
(74) *Attorney, Agent, or Firm* — Well St. John P.S.

(57) ABSTRACT

A field effect transistor construction includes a semiconductive channel core. A source/drain region is at opposite ends of the channel core. A gate is proximate a periphery of the channel core. A gate insulator is between the gate and the channel core. The gate insulator has local regions radially there-through that have different capacitance at different circumferential locations relative to the channel core periphery. Additional constructions, and methods, are disclosed.

6 Claims, 5 Drawing Sheets (51) Int. Cl.
*H01L 29/788* (2006.01)
*G11C 11/22* (2006.01)
*G11C 16/04* (2006.01)
*G11C 16/10* (2006.01)
*H01L 27/11568* (2017.01)
*H01L 29/792* (2006.01)
*H01L 27/1159* (2017.01)

(52) U.S. Cl.
CPC .......... *G11C 16/10* (2013.01); *H01L 27/1159* (2013.01); *H01L 27/11568* (2013.01); *H01L 29/4234* (2013.01); *H01L 29/42324* (2013.01); *H01L 29/42368* (2013.01); *H01L 29/42376* (2013.01); *H01L 29/42392* (2013.01); *H01L 29/788* (2013.01); *H01L 29/78391* (2014.09); *H01L 29/7923* (2013.01)

(58) Field of Classification Search
CPC ............. H01L 29/6684; H01L 29/7887; H01L 29/792; H01L 29/42324; H01L 29/42368; H01L 29/42376; H01L 29/78391; H01L 29/788
See application file for complete search history.

(56) References Cited

U.S. PATENT DOCUMENTS

| | | | | |
|---|---|---|---|---|
| 7,018,876 | B2* | 3/2006 | Mathew et al. | 438/151 |
| 7,816,242 | B2* | 10/2010 | Ono | 438/591 |
| 8,815,690 | B2* | 8/2014 | Cui et al. | H01L 29/42312 257/366 |
| 2005/0282345 | A1 | 12/2005 | Mathew et al. | |
| 2009/0061610 | A1* | 3/2009 | Ono | H01L 29/42384 438/591 |
| 2009/0101967 | A1 | 4/2009 | Lai et al. | |
| 2011/0309322 | A1 | 12/2011 | Hwang | |
| 2012/0140542 | A1 | 6/2012 | Liu | |
| 2012/0153370 | A1 | 6/2012 | Furuta et al. | |
| 2012/0223387 | A1* | 9/2012 | Cui | H01L 29/7391 257/366 |
| 2013/0270512 | A1 | 10/2013 | Radosavljevic et al. | |

OTHER PUBLICATIONS

Ferroelectric RAM; http://en.wikipedia.org/wiki/Ferroelectric_RAM; Last modified Jan. 16, 2014; 6 pp.

* cited by examiner

FIELD EFFECT TRANSISTOR CONSTRUCTIONS WITH GATE INSULATOR HAVING LOCAL REGIONS RADIALLY THERE-THROUGH THAT HAVE DIFFERENT CAPACITANCE AT DIFFERENT CIRCUMFERENTIAL LOCATIONS RELATIVE TO A CHANNEL CORE PERIPHERY

TECHNICAL FIELD

Embodiments disclosed herein pertain to field effect transistor constructions and to methods of programming field effect transistors to one of at least three different programmed states.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field-effect transistors may also include additional structure, for example reversibly programmable charge storage regions as part of the gate construction. Transistors other than field-effect transistors, for example bipolar transistors, may additionally or alternately be used in memory cells. Transistors may be used in many types of memory. Further, transistors may be used and formed in arrays other than memory.

One type of transistor is a ferroelectric field effect transistor (FeFET) wherein at least some portion of the gate construction comprises ferroelectric material. Such materials are characterized by two stable polarized states. These different states in field effect transistors may be characterized by different threshold voltage ($V_t$) for the transistor or by different channel conductivity for a selected operating voltage. Polarization state of the ferroelectric material can be changed by application of suitable programming voltages, and which results in one of high channel conductance or low channel conductance. The high and low conductance, invoked by the ferroelectric polarization state, remains after removal of the programming gate voltage (at least for a time). The status of the channel conductance can be read by applying a small drain voltage which does not disturb the ferroelectric polarization.

DETAILED DESCRIPTION OF EXAMPLE EMBODIMENTS

Figure 1:
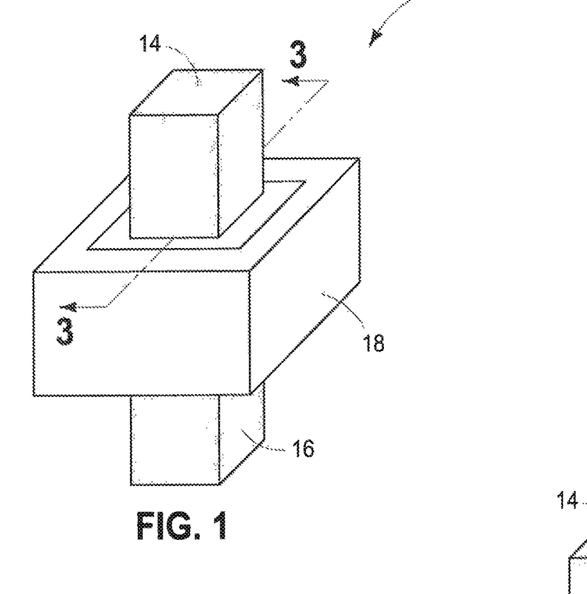
FIG. 1 is a diagrammatic perspective view of a portion of a substrate fragment comprising a field effect transistor construction in accordance with an embodiment of the invention.
Figure 2:
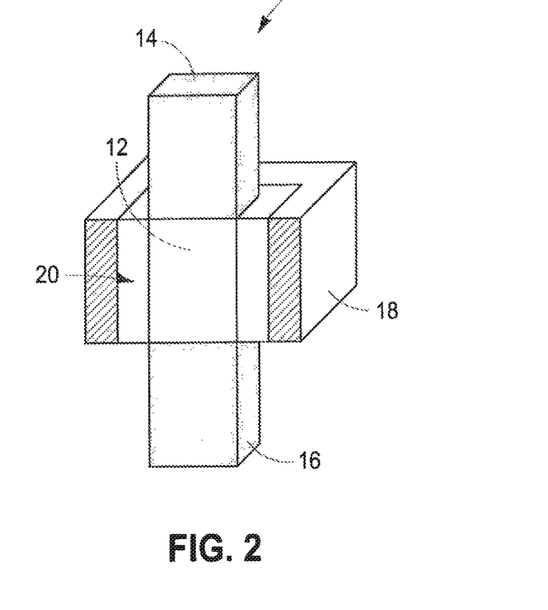
FIG. 2 is a view of the FIG. 1 construction with some material removed for clarity.
Figure 3:
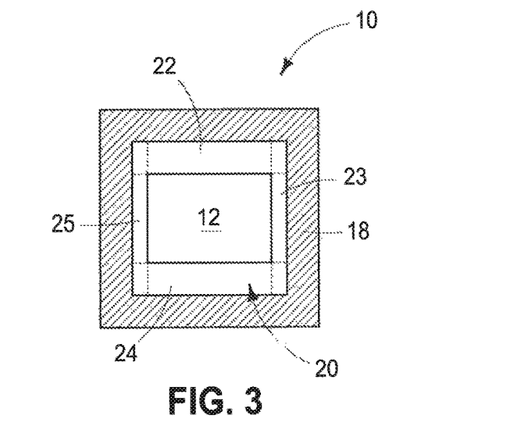
FIG. 3 is a section view taken through line 3-3 in FIG. 1.

An example field effect transistor construction in accordance with an embodiment of the invention is described initially with references to FIGS. 1-3. Such show a transistor construction 10 in the absence of surrounding materials and circuitry for clarity. Other components of integrated circuitry may be elevationally outward, elevationally inward, and/or to the sides with respect to transistor construction 10. Additionally, multiple such transistors would likely constitute part of integrated circuitry, for example an array of such transistors that might be used in memory circuitry, logic circuitry, or other circuitry.

Any of the materials and/or structures described herein may be homogenous or non-homogenous, and regardless may be continuous or discontinuous over any material that such overlie. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. Further, unless otherwise stated, each material may be formed using any suitable existing or yet-to-be-developed technique, with atomic layer deposition, chemical vapor deposition, physical vapor deposition, epitaxial growth, diffusion doping, and ion implanting being examples.

Field effect transistor construction 10 is shown as being vertically oriented, although horizontal orientation or orientations other than vertical or horizontal may be used. In this document, vertical is a direction generally orthogonal to horizontal, with horizontal referring to a general direction along a primary surface relative to which a substrate is processed during fabrication. Further, vertical and horizontal as used herein are generally perpendicular directions relative one another independent of orientation of the substrate in three dimensional space. Additionally, elevational, above, and below are with reference to the vertical direction. Further in the context of this document, a vertically oriented transistor is characterized by predominant current flow through the channel in the vertical direction. A horizontally oriented transistor is characterized by predominant current flow through the channel in the horizontal direction.

Field effect transistor construction 10 includes a semiconductive channel core 12 and a source/drain region 14, 16 at opposite ends of channel core 12. Any suitable and appropriately doped semiconductive material may be used, for example monocrystalline or polycrystalline silicon. Transistor construction 10 may be n-type or p-type, and LDD, halo, or other regions (not shown) may be formed as part of components 12, 14, and/or 16. A gate 18 is proximate a periphery of channel core 12, with a gate insulator (i.e., electrical) 20 being provided between gate 18 and channel core 12. In one embodiment, gate 18 completely surrounds channel core 12, and in one embodiment gate insulator 20 completely surrounds channel core 12. Gate 18 may be composed of any suitable conductive (i.e., electrically) material such as one or more of conductively-doped semiconductive material(s), elemental metal(s), alloy(s) of elemental metals, and conductive metal compound(s). In one embodiment, gate 18 may comprise charge trapping material as will be described below. Example radial thicknesses for channel core 12, gate insulator 20, and gate 18 are about 100 to 300 Angstroms, about 10 to 100 Angstroms, and about 50 to 400 Angstroms, respectively.

In one embodiment, the gate insulator has local regions radially there-through that have different (i.e., at least two) capacitances at different circumferential locations relative to the periphery of the channel core, for example four such local regions 22, 23, 24, and 25 as designated in FIG. 3. As examples, different capacitance might be achieved by one or both of different composition or different thickness between at least two of local regions 22, 23, 24, and 25. The gate insulator may be homogenous about channel core 12 or may not be homogenous about channel core 12. Regardless, in one embodiment, the local regions are at least one of individually and collectively of at least two different radial thicknesses, with FIG. 3 showing local regions 22, 23, 24, and 25 being individually of constant radial thickness but collectively of two different radial thicknesses. FIG. 3 as an example depicts local regions 22 and 24 being of the same and constant radial thickness. Local regions 23 and 25 are also of the same and constant radial thickness but of a value less than the thicknesses of local regions 22 and 24. Alternately as an example, the local regions may be individually and collectively of constant radial thickness (not shown in FIGS. 1-3) with different capacitance achieved at different circumferential locations relative to the channel core periphery by different composition between at least two locations. Additionally, fewer than four or more than four local regions may be used, and regardless of whether the number of local regions is even or odd.

In one embodiment, gate insulator 20 comprises ferroelectric material. Any suitable existing or yet-to-be-developed ferroelectric material may be used. Examples include ferroelectrics that have one or more of transition metal oxide, zirconium, zirconium oxide, hafnium, hafnium oxide, lead zirconium titanate, and barium strontium titanate, and may have dopant therein which comprises one or more of silicon, aluminum, lanthanum, yttrium, erbium, calcium, magnesium, strontium, and a rare earth element. Two specific examples are $Hf_xSi_yO_z$ and $Hf_xZr_yO_z$.

Alternately, gate insulator 20 may not comprise any ferroelectric material, and in one embodiment the transistor construction 10 is devoid of any ferroelectric material. In the context of this document, devoid of any ferroelectric material means a construction not having any region that exhibits ferroelectric polarizing switching. Example, non-ferroelectric materials include one or more of silicon dioxide, silicon nitride, and hafnium oxide. In one embodiment where the gate insulator comprises ferroelectric material, the ferroelectric material is directly against semiconductive channel core 12, for example as shown (e.g., MFS construction). In one embodiment where gate insulator 20 comprises ferroelectric material, non-ferroelectric material (not shown) may be between the ferroelectric material and channel core 12 (e.g., MFIS construction).

Figure 4:
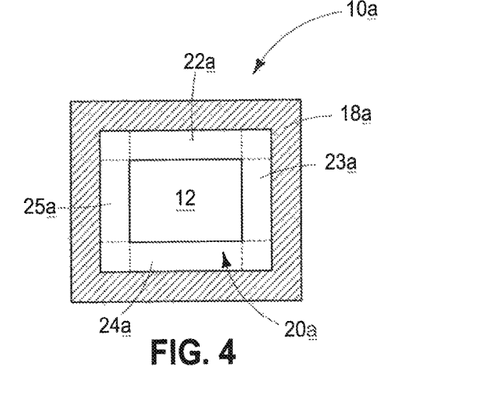
FIG. 4 is a section view of a portion of an alternate embodiment transistor construction.

FIG. 4 depicts an alternate embodiment field effect transistor construction 10a to that as shown by FIG. 3. Like numerals from the above-described embodiments have been used where appropriate, with some construction differences being indicated with the suffix "a". Gate insulator 20a is shown as being of substantially constant radial thickness (i.e., but for at the four corner regions due to variable diagonal-like thickness) about channel core 12. Different capacitance may be achieved by using different compositions within at least some of at least any two local regions 22a, 22b, 22c, and 22d. Any other attribute(s) or construction(s) as described above may be used.

Figure 5:
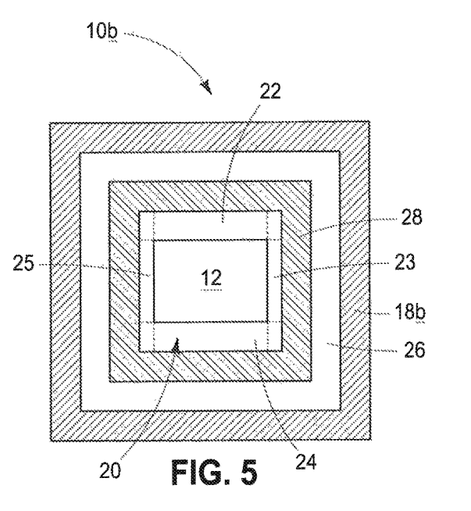
FIG. 5 is a section view of a portion of an alternate embodiment transistor construction.

FIG. 5 depicts an alternate embodiment field effect transistor construction 10b to those shown by FIGS. 3 and 4. Like numerals from the above-described embodiments have been used where appropriate, with some construction differences being indicated with the suffix "b" or with different numerals. Construction 10b includes ferroelectric material 26 radially inward of gate 18b. Conductive material 28 is radially inward of ferroelectric material 26, with both ferroelectric material 26 and conductive material 28 being radially outward of gate insulator 20. Ferroelectric material 26 may be of any suitable composition such as those ferroelectric materials described above. Likewise, conductive material 28 may be of any suitable composition such as those conductive materials described above with respect to gate 18, and material 28 may be of the same or different composition from that of material 18. Gate insulator 20 may be non-ferroelectric, with in one example construction 10*b* being MFMIS. Additionally, people of skill in the art may consider the "F" and "I" in an MFMIS transistor construction as collectively being the gate insulator of the construction and having a conductive material M sandwiched between "F" and "I" as part of that gate insulator construction. Example radial thicknesses for ferroelectric material 26 and conductive material 28 are about 10 to 100 Angstroms and about 10 to 200 Angstroms, respectively. Any other attribute(s) or construction(s) as described above may be used.

Figure 15:
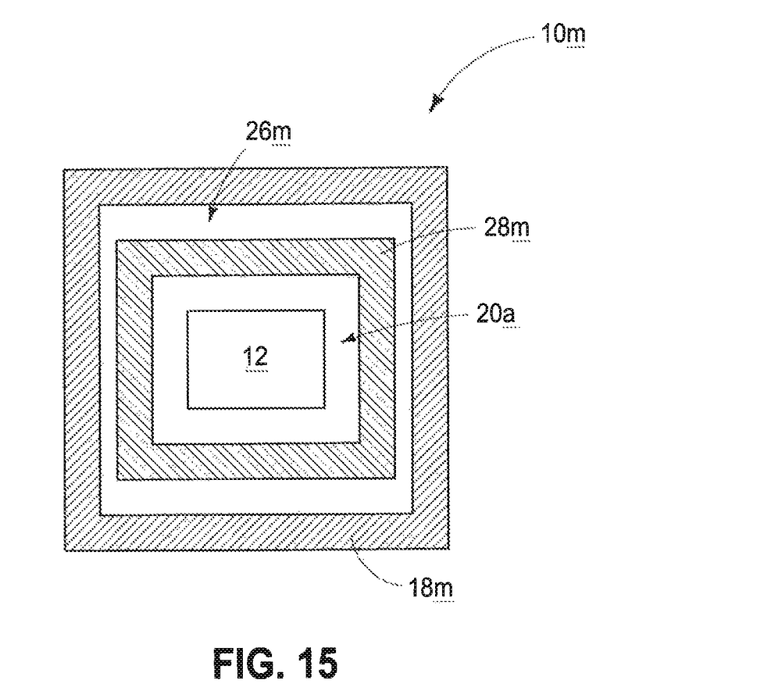
FIG. 15 is a section view of a portion of an alternate embodiment transistor construction.

In an alternate embodiment corresponding to that of FIG. 5, ferroelectric material 26 may have any of the structural and/or different composition attributes as those described for dielectric material 20 regardless of the structural and composition attributes of dielectric material 20. One such alternate embodiment is shown in FIG. 15 with respect to a field effect transistor construction 10*m*. Like numerals from the above-described embodiments have been used where appropriate, with some construction differences being indicated with the suffix "m". Example construction 10*m* has a core structure 12/20*a* like that of FIG. 4, with conductive material 28*m* there-about. Thickness of ferroelectric material 26*m* is configured analogously to that of dielectric material 20 shown in FIG. 3. Accordingly, ferroelectric material 26*m* has local regions radially there-through of different radial thickness at different circumferential locations relative to the channel core periphery. Any other attribute(s) or construction(s) as described above may be used.

Figure 6:
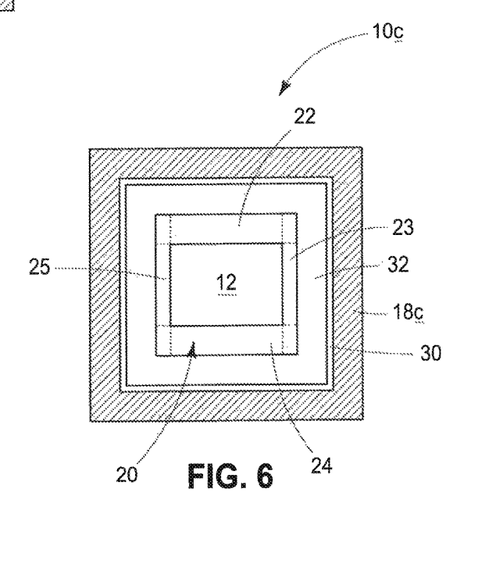
FIG. 6 is a section view of a portion of an alternate embodiment transistor construction.

FIG. 6 illustrates an alternate embodiment field effect transistor construction 10*c* to those shown by FIGS. 3-5 and 15, and in the form of a flash transistor construction. Like numerals from the above-described embodiments have been used where appropriate, with some construction differences being indicated with the suffix "c" or with different numerals. Gate 18*c* in transistor construction 10*c* is a control gate and gate insulator 20 is a tunnel dielectric. Dielectric material 30 is radially inward of control gate 18*c* and charge trapping material 32 is radially inward of dielectric material 30. Charge trapping material 32 and dielectric material 30 are radially outward of tunnel dielectric 20. Example dielectrics 20 include one or a combination of silicon oxide and silicon nitride, and ferroelectrics may be used. Example charge trapping material includes any of silicon nitride, aluminum oxide, and hafnium oxide with or without suitable dopants. Ideally, the charge trapping material is a material that has localized energy barriers that prevent electrons from hopping from one site to another site within the charge trapping material. Example thicknesses for dielectric material 30 and charge trapping material 32 are about 5 to 200 Angstroms and about 50 to 400 Angstroms, respectively. Any other attribute(s) or construction(s) as described above may be used.

In one embodiment in accordance with the invention, a field effect transistor construction includes a gate insulator that comprises at least two pairs of two diametrically opposed local regions extending radially through the gate insulator at different circumferential locations relative to the channel core periphery, with the at least two pairs having different collective capacitance. For example with respect to the embodiments of FIGS. 1-6, local regions 22, 24 (FIGS. 3, 5, and 6) and local regions 22*a*, 24*a* (FIG. 4) may respectively be considered as one pair having the two stated local regions which are diametrically opposed from one another relative to channel core 12. Local regions 23, 25 (FIGS. 3, 5, and 6) and local regions 23*a*, 25*a* (FIG. 4) may respectively be considered as another pair of two diametrically opposed local regions at different circumferential locations relative to channel core 12. With respect to each pair, collective (i.e., total) capacitance from the two opposed regions is different in comparison to the other pair in the respective transistor construction. In one embodiment, the local regions individually within each pair have the same capacitance. Attributes as just described also apply to the construction of FIG. 15. Any other attribute(s) or construction(s) as described above may be used.

Figures 7, 8, 9, 10:
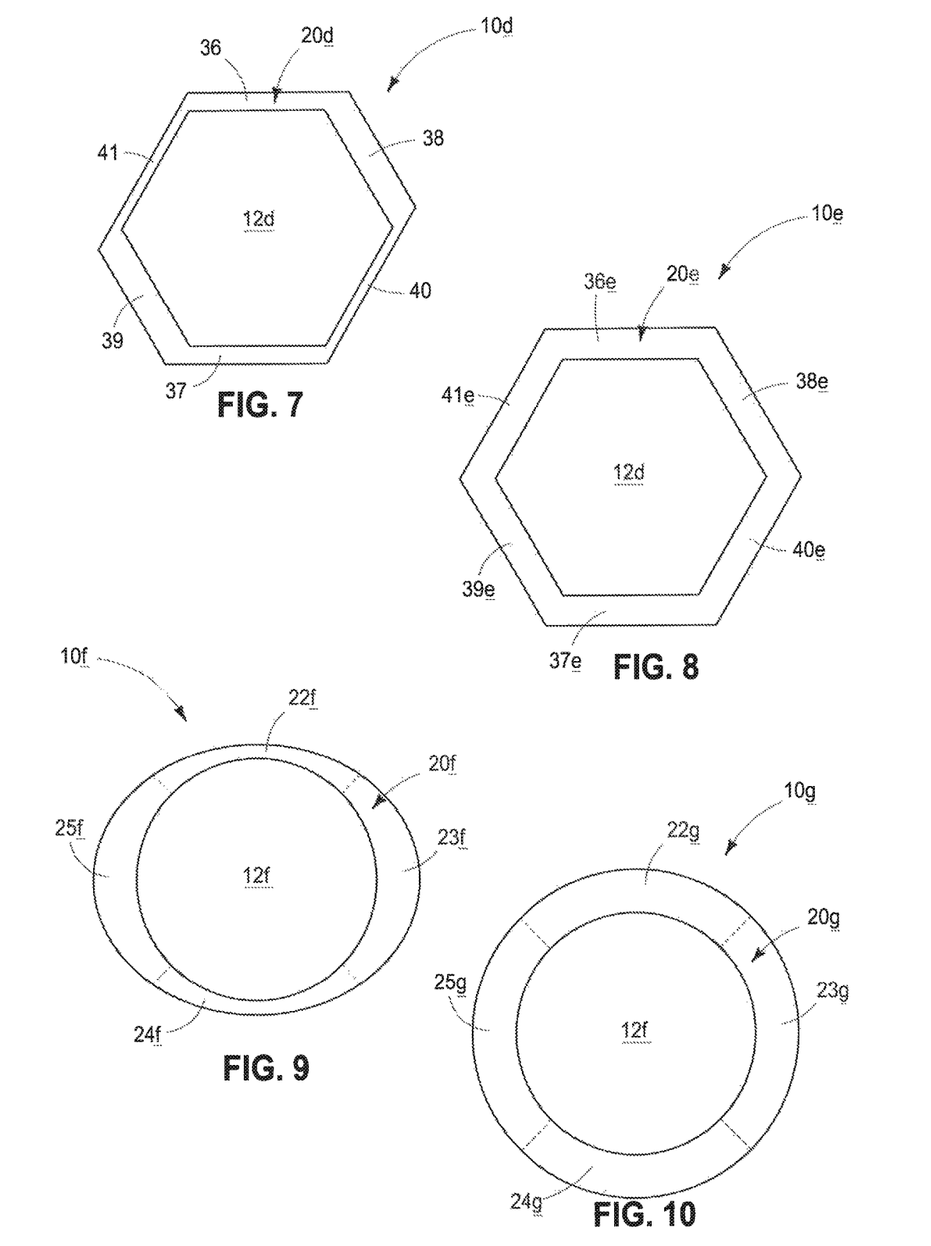
FIG. 7 is a section view of a portion of an alternate embodiment transistor construction with some material removed for clarity.
FIG. 8 is a section view of a portion of an alternate embodiment transistor construction with some material removed for clarity.
FIG. 9 is a section view of a portion of an alternate embodiment transistor construction with some material removed for clarity.
FIG. 10 is a section view of a portion of an alternate embodiment transistor construction with some material removed for clarity.

FIGS. 1-6 and 15 show example embodiments wherein the transistor construction comprises only two pairs of diametrically opposed local regions that extend radially through the gate insulator at different circumferential locations relative to the channel core periphery. Embodiments also contemplate more than two of such pairs (e.g., 3, 4, 5, etc.). An alternate such example field effect transistor construction 10*d* is shown in FIG. 7. Like numerals from the above-described embodiments have been used where appropriate, with some construction differences being indicated with the suffix "d" or with different numerals. FIG. 7 corresponds to the construction views shown by FIGS. 3-6, and for simplicity only shows channel core 12*d* and immediately surrounding gate insulator 20*d*. Components radially outward thereof may be as described in any of the above embodiments. FIGS. 3-6 and 15 show semiconductor channel core 12 as being of a quadrilateral shape (e.g., rectangular) in horizontal cross-section whereas semiconductor channel core 12*d* in FIG. 7 is hexagonal. Additionally by way of example, FIG. 7 shows three pairs of two diametrically opposed local regions extending radially through gate insulator 20*d* at different circumferential locations relative to the periphery of channel core 12*d*, for example a pair 36, 37; a pair 38, 39; and a pair 40, 41. FIG. 7 also shows an example embodiment wherein each local region individually is of constant radial thickness along a majority of its respective circumferential length and with the opposing local locations within each pair being of the same radial thickness along a majority of their respective circumferential lengths. Additionally, the radial thicknesses of local regions 38, 39 are greater than those of local regions 36, 37 which in turn are also greater than those of local regions 40, 41. However, any other attribute(s) or construction(s) as described above may be used.

FIG. 8 depicts an alternate embodiment hexagonal core field effect transistor construction 10*e* to that of construction 10*d* of FIG. 7. Like numerals from the above-described embodiments have been used where appropriate, with some construction differences being indicated with the suffix "e". Again for simplicity, only semiconductor channel core 12*d* and immediately surrounding gate insulator 20*e* are shown. In FIG. 8, gate insulator 20*e* is of substantial constant radial thickness about semiconductor channel core 12*d* (i.e., but for at the corner regions due to variable diagonal-like thickness), whereby local regions 36*e*, 38*e*, 40*e*, 37*e*, 39*e*, and 41*e* are also of the same radial thickness. Any other attribute(s) or construction(s) as described above may be used.

The above described embodiments depict linearly straight-sided semiconductor channel cores, for example being four-sided in FIGS. 1-6 and 15, and six-sided in FIGS. 7 and 8. Alternate shaped and number-of-sides polygons may be used, and whether such are regular or irregular polygons. Regardless, the local regions may have radially-outermost surfaces that are straight along at least a majority of their respective circumferential lengths (e.g., that which is in a general circumferential direction about the semiconductor channel core). Alternate constructions are contemplated, for example wherein the local regions have radially outermost surfaces that are curved along at least a majority of their respective circumferential lengths. One such example embodiment field effect transistor construction 10f is shown in FIG. 9. Like numerals from the above-described embodiments have been used where appropriate, with some construction differences being indicated with the suffix "f". Again for simplicity, only semiconductor channel core 12f and immediately surrounding gate insulator 20f are shown. In construction 10f, the circumference of semiconductor channel core 12f is shown as being circular although other configurations may be used. Example gate insulator 20f is shown as not being circular, for example having radially thinner (i.e., on average) local regions 22f, 24f than local regions 23f, 25f. Fewer or more than four regions may alternately be used. Any other attribute(s) or construction(s) as described above may be used.

FIG. 10 depicts another embodiment field effect transistor construction 10g as an alternate to that of FIG. 9. Like numerals from the above-described embodiments have been used where appropriate, with some construction differences being indicated with the suffix "g". Again for simplicity, only semiconductor channel core 12f and immediately surrounding gate insulator 20g are shown. Gate insulator 20g is also circular and concentric with the example circular outline of semiconductor channel core 12f. Thereby, gate insulator 20g is of constant radial thickness about semiconductor channel core 12f, with example local regions 22g, 23g, 24g, and 25g also thereby being of constant radial thickness about to the channel core. At least two different capacitances among the example four local regions may be accomplished by varying composition of the gate insulator material within at least two local regions, by way of example. Any other attribute(s) or construction(s) as described above may be used.

The above described structures may be formed by any existing or yet-to-be-developed manners. For example with respect to formation of four-sided semiconductor channel cores, longitudinally elongated horizontal trenches can be initially formed into semiconductive material. The semiconductive material sidewalls of those trenches can be lined with a suitable insulator material of a desired gate insulator composition. Horizontal trenches can then be formed orthogonally to the initially-formed trenches whereby four-sided semiconductive pillars are formed which will individually constitute semiconductor channel cores of individual field effect transistor constructions. At this point, two of the opposing sides of those cores are covered by the gate insulator lining, whereas the other opposing sides are not. Additional insulator material (of the same or different composition from the first) can then be deposited to line the previously un-lined surfaces of the cores as well as additionally deposit laterally/radially onto the previously-deposited gate insulator. Thereby, the semiconductor channel core sides over which the initial insulator was deposited will be radially thicker than radial thickness of the other sidewalls of the semiconductor channel cores. Alternate or additional processing may occur whereby certain different circumferential locations about a channel core are masked or exposed while gate insulator is formed laterally over some local region(s) and not others.

Field effect transistor constructions in accordance with the above-described embodiments having different capacitance at different circumferential locations about a semiconductor channel core may be programmed into at least three available different programmed states that are characterized by different overall $V_t$ relative one another. A first example is described with reference to the embodiments of FIGS. 1-3 where gate insulator 20 is ferroelectric. FIGS. 11, 12, 13, and 14 show four possible or available different programmed $V_t$ states. Again for simplicity, each figure only shows ferroelectric 20 surrounding semiconductor channel core 12. Each of two possible ferroelectric polarization states is shown in the respective regions 22, 23, 24, and 25 by an arrow indicating one of two directions of ferroelectric polarization individually in such regions.

Figure 11:
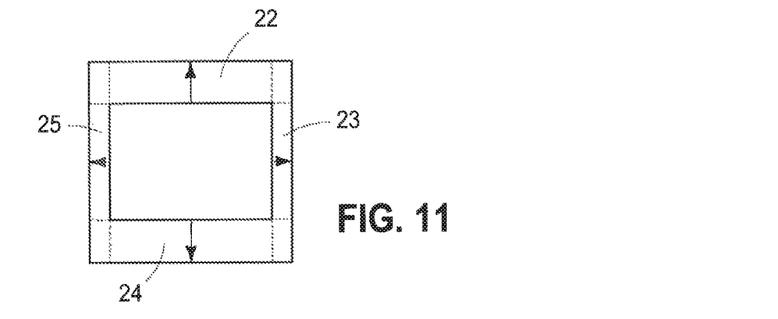
FIG. 11 is a diagrammatic section view of a portion of the FIG. 1 substrate in one programmed state.
Figure 14:
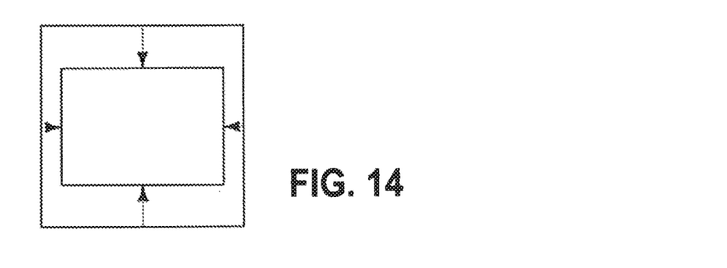
FIG. 14 is a diagrammatic section view of a portion of the FIG. 1 substrate in one programmed state.

FIG. 11 shows a unipolarization state wherein each local region is polarized in the same polarization state with all arrows pointing radially outward, which for convenience is referred to below as "out-arrow". FIG. 14 shows another unipolarization state wherein each local region is polarized in the other same polarization state with all arrows pointing radially inward, which for convenience is referred to below as "in-arrow". Either state may be arrived at directly from any previous state by applying suitable gate programming voltage sufficient to change any opposite state to the desired state. Any local region already at the desired state will simply stay there upon application of the polarization change voltage.

Figure 12:
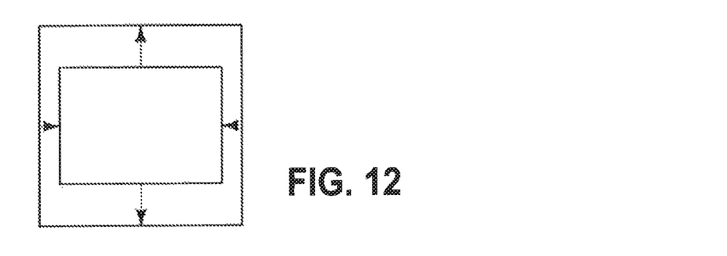
FIG. 12 is a diagrammatic section view of a portion of the FIG. 1 substrate in one programmed state.
Figure 13:
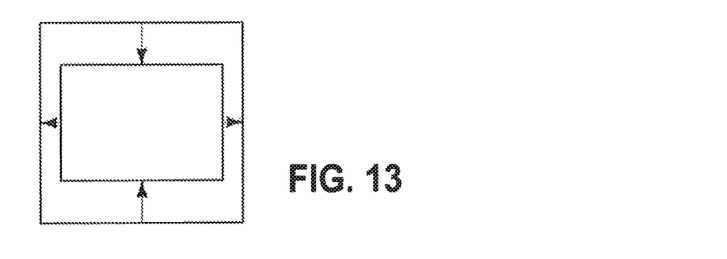
FIG. 13 is a diagrammatic section view of a portion of the FIG. 1 substrate in one programmed state.

FIGS. 12 and 13 show possible mixed polarization states. For example, if in the FIG. 11 programmed state, if the total capacitance of the thinner opposing local regions 23, 25 is greater than that of thicker local regions 22, 24, a programming voltage may be applied to the surrounding gate (not shown in FIGS. 11-14) which is sufficient to reverse the polarization direction in thinner regions 23, 25 to in-arrow but insufficiently great to reverse the direction in thicker regions 22, 24 to in-arrow, thus resulting in going to the FIG. 12 programmed state from that of FIG. 11. Likewise, the programmed state of FIG. 13 can be obtained from that of FIG. 14 by application of suitable programming voltage which is sufficient to reverse the polarization in the thinner local regions to out-arrow but insufficient to reverse polarization in the thicker local regions to out-arrow.

In each of the example four programmed states, the field effect transistor construction will have a different $V_t$ relative to each of the other programmed states. For example, while local threshold voltage or local capacitance along a circumferential length of a channel core surface may be different for different local regions of the gate insulator, such individually in each case contributes to a collective or total $V_t$ for the whole transistor device, which effectively is a different $V_t$ for the device from any of the other programmed states.

While the above description with respect to FIGS. 11-14 was referring to the embodiment of FIGS. 1-3 wherein insulator 20 is ferroelectric, such also applies to the embodiments of FIGS. 5 and 15 relative to ferroelectric 26/26m. For example, polarization change can occur to one of the depicted four states in FIGS. 11-14 from different programming voltages but occurring in ferroelectric 26/26m as opposed to occurring in a non-ferroelectric 20. This is due to different capacitance being provided across the local regions in insulator 20 due to different radial thicknesses and/or material composition.

Analogously, where different capacitance is provided within different local regions (i.e., different local capacitance) due to different compositions within insulator 20a/20d/20e/20f/20g, different programming voltages can be used to result in different overall $V_t$'s for the construction, thus defining different programmed states.

Analogous programming can occur in a flash device of FIG. 6 due to different local capacitance at two (at least two)

different circumferential locations relative to a periphery of a channel core. In such case, different $V_t$ is obtained by different programmed voltage not from changing polarization of a ferroelectric but by varied quanta of charge injection into charge trapping material at different circumferential locations due to different local capacitance.

Embodiments of the invention include methods of programming field effect transistors not necessarily encompassing one or more of the above structural attributes. In one such example embodiment, a method includes programming a ferroelectric field effect transistor to one of at least three available different program states that are characterized by different $V_t$ (i.e., overall $V_t$) relative one another. The transistor being programmed comprises a semiconductor channel core. Ferroelectric material is proximate a periphery of the channel core. A gate is proximate a periphery of the ferroelectric material. The programming includes applying a programming voltage to the gate that reverses polarization direction within the ferroelectric material at some circumferential location and not at another circumferential location to change $V_t$ of the transistor from what it was prior to applying the programming voltage. The above example programming going from either FIG. 11 to FIG. 12 or from FIG. 14 to FIG. 13 are example such embodiment methods, and regardless of whether applied to the FIG. 3, 4, or 5 embodiments.

In one embodiment in accordance with the invention, a method includes programming a ferroelectric field effect transistor to one of at least four available different programmed states characterized by different $V_t$ relative one another. The transistor comprises a semiconductor channel core having at least four radially outermost surfaces that are straight along at least a majority of their respective circumferential lengths. A ferroelectric material is proximate the outermost surfaces. A gate is proximate a periphery of the ferroelectric material. The programming method includes applying a programming voltage to the gate that reverses polarization direction within the ferroelectric material that is over a first two diametrically opposed of the at least four surfaces but not reversing polarization direction within the ferroelectric material that is over a second two of diametrically opposed of the at least four surfaces. Again, the programming depicted in going from FIG. 11 to FIG. 12 and from FIG. 14 to FIG. 13 are each example such methods.

Analogous programming may occur with respect to a flash field effect transistor construction. For example, a flash transistor construction as shown in FIG. 6 may be programmed into one of three different programmed states. One programming state would be where the charge trapping material all circumferentially about channel core is fully loaded with charge. Another state would be where the charge trapping material is fully discharged all circumferentially about the channel core. A third state would be where the charge trapping material within one of two pairs of diametrically opposing regions is fully loaded with charge and the other pair of diametrically opposed regions is loaded with a lower quanta of charge than are the fully loaded regions. Thereby, three different overall $V_t$'s are provided, one for each different state and which may be sensed. The third intermediate charged state may be arrived at directly from the fully discharged state.

A method embodiment of the invention includes programming a field effect transistor to one of at least three available different programmed states characterized by different $V_t$ relative one another. The transistor comprises a semiconductor channel core. A tunnel dielectric is proximate a periphery of the channel core. Charge trapping material is proximate a periphery of the tunnel dielectric. Outer dielectric is proximate a periphery of the charge trapping material. Conductive control gate material is proximate a periphery of the outer dielectric. The programming method comprises applying a programming voltage to the control gate that injects different quanta of electrons into the charge trapping material at different circumferential locations to change $V_t$ of the transistor from what it was prior to application the programming voltage. The above processing as just described with respect to a flash transistor construction is an example where going from the fully discharged to the intermediate charged state.

Some embodiments of the invention encompass field effect transistor constructions independent of whether the gate insulator has local regions radially there-through that have different capacitance at different circumferential locations relative to the channel core periphery. In one such embodiment, a field effect transistor construction comprises a semiconductor channel core and a source/drain region at opposite ends of the channel core. A gate is proximate a periphery of the channel core. A ferroelectric gate insulator is between the gate and the channel core. The ferroelectric gate insulator has local regions radially there-through of different radial thickness at different circumferential locations relative to the channel core periphery. In one embodiment, such local regions having different radial thickness do have different capacitance relative one another. Any other attribute(s) or construction(s) as described above may be used.

In another such embodiment, a field effect transistor construction comprises a semiconductor channel core and a source/drain region at opposite ends thereof. A gate construction is proximate a periphery of the channel core. An outer conductive material is proximate the channel core periphery. Outer ferroelectric material is proximate the channel core periphery radially inward of the outer conductive material. Inner conductive material is proximate the channel core periphery radially inward of the outer ferroelectric material. Inner dielectric is radially between the inner conductive material and the channel core, with the inner dielectric having local regions radially there-through of different radial thickness at different circumferential locations relative to the channel core periphery. In one embodiment, the local regions having different radial thicknesses do have different capacitance relative one another. Any other attribute(s) or construction(s) as described above may be used.

In one embodiment, a field effect transistor construction comprises a semiconductor channel core having four radially outermost surfaces that are straight along at least a majority of their respective circumferential lengths. A source/drain region is at opposite ends of the channel core. A gate is proximate a periphery of the channel core. A gate insulator is between the gate and the channel core over each of the four surfaces. The gate insulator that is over a first two of diametrically opposed of the four surfaces is radially thinner than that over a second two of diametrically opposed of the four surfaces. In one embodiment, the radially thinner gate insulator provides greater local capacitance than does the gate insulator than over the second two of the diametrically opposed four surfaces.

CONCLUSION

In some embodiments, a field effect transistor construction comprises a semiconductive channel core. A source/drain region is at opposite ends of the channel core. A gate is proximate a periphery of the channel core. A gate insulator is between the gate and the channel core. The gate insulator has local regions radially there-through that have different capacitance at different circumferential locations relative to the channel core periphery.

In some embodiments, a field effect transistor construction comprises a semiconductive channel core. A source/drain region is at opposite ends of the channel core. A gate is proximate a periphery of the channel core. A ferroelectric gate insulator is between the gate and the channel core, the ferroelectric gate insulator having local regions radially there-through of different radial thickness at different circumferential locations relative to the channel core periphery.

In some embodiments, a field effect transistor construction comprises a semiconductive channel core. A source/drain region is at opposite ends of the channel core. A gate is proximate a periphery of the channel core. A ferroelectric gate insulator is between the gate and the channel core, the ferroelectric gate insulator being of constant radial thickness about the channel core and the ferroelectric gate insulator having local regions of different composition at different circumferential locations relative to the channel core periphery.

In some embodiments, a field effect transistor construction comprises a semiconductive channel core. A source/drain region is at opposite ends of the channel core. A gate construction is proximate a periphery of the channel core. The gate construction comprises outer conductive material proximate a periphery of the channel core. Outer ferroelectric material is proximate a periphery of the channel core radially inward of the outer conductive material. Inner conductive material is proximate the channel core periphery radially inward of the outer ferroelectric material. Inner dielectric is radially between the inner conductive material and the channel core. The inner dielectric has local regions radially there-through of different radial thickness at different circumferential locations relative to the channel core periphery.

In some embodiments, a field effect transistor construction comprises a semiconductive channel core. A source/drain region is at opposite ends of the channel core. A gate construction is proximate a periphery of the channel core. The gate construction comprises outer conductive material proximate the channel core periphery. Outer ferroelectric material is proximate the channel core periphery radially inward of the outer conductive material. The outer ferroelectric material has local regions radially there-through of different radial thickness at different circumferential locations relative to the channel core periphery. Inner conductive material is proximate the channel core periphery radially inward of the outer ferroelectric material. Inner dielectric is radially between the inner conductive material and the channel core.

In some embodiments, a field effect transistor construction comprises a semiconductive channel core. A source/drain region is at opposite ends of the channel core. A gate is proximate a periphery of the channel core. A gate insulator is between the gate and the channel core. The gate insulator comprises at least two pairs of two diametrically opposed local regions extending radially through the gate insulator at different circumferential locations relative to the channel core periphery. The at least two pairs having different collective capacitance.

In some embodiments, a field effect transistor construction comprises a semiconductive channel core having four radially outermost surfaces that are straight along at least a majority of their respective circumferential lengths. A source/drain region is at opposite ends of the channel core. A gate is proximate a periphery of the channel core. A gate insulator is between the gate and the channel core over each of the four surfaces. The gate insulator that is over a first two of diametrically opposed of the four surfaces is radially thinner than over a second two of diametrically opposed of the four surfaces.

In some embodiments, a method comprises programming a ferroelectric field effect transistor to one of at least three available different programmed states characterized by different $V_t$ relative one another. The transistor comprises a semiconductive channel core. Ferroelectric material is proximate a periphery of the channel core. A gate is proximate a periphery of the ferroelectric material. The method comprises applying a programming voltage to the gate that reverses polarization direction within the ferroelectric material at some circumferential location and not at another circumferential location to change $V_t$ of the transistor from what it was prior to said applying.

In some embodiments, a method comprises programming a ferroelectric field effect transistor to one of at least four available different programmed states characterized by different $V_t$ relative one another. The transistor comprises a semiconductive channel core having at least four radially outermost surfaces that are straight along at least a majority of their respective circumferential lengths. A ferroelectric material is proximate the outermost surfaces. A gate is proximate a periphery of the ferroelectric material. The method comprises applying a programming voltage to the gate that reverses polarization direction within the ferroelectric material that is over a first two of diametrically opposed of the at least four surfaces but not reversing polarization direction within the ferroelectric material that is over a second two of diametrically opposed of the at least four surfaces.

In some embodiments, a method comprises programming a field effect transistor to one of at least three available different programmed states characterized by different $V_t$ relative one another. The transistor comprises a semiconductive channel core. A tunnel dielectric is proximate a periphery of the channel core. Charge trapping material is proximate a periphery of the tunnel dielectric. Outer dielectric is proximate a periphery of the charge trapping material. Conductive control gate material is proximate a periphery of the outer dielectric. The method comprises applying a programming voltage to the control gate that injects different quanta of electrons into the charge trapping material at different circumferential locations to change $V_t$ of the transistor from what it was prior to said applying.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted i accordance with the doctrine of equivalents.

The invention claimed is:

1. A field effect transistor construction, comprising:
    a semiconductive channel core having four radially outermost surfaces that are straight along at least a majority of their respective circumferential lengths;
    a source/drain region at opposite ends of the channel core, the channel core comprising a minimum channel length there-through from an edge of one of the source/drain regions to an edge of the other source/drain region;

a gate proximate a periphery of the channel core;
a gate insulator between the gate and the channel core over each of the four surfaces, the gate insulator over a first two of diametrically opposed of the four surfaces being radially thinner along all of the minimum channel length than over a second two of diametrically opposed of the four surfaces along all of the minimum channel length; and
the radially thinner gate insulator providing greater local capacitance than does the gate insulator over said second two.

2. A field effect transistor construction, comprising:
a semiconductive channel core;
a source/drain region at opposite ends of the channel core, the channel core comprising a minimum channel length there-through from an edge of one of the source/drain regions to an edge of the other source/drain region;
a gate proximate a periphery of the channel core, the gate completely surrounding the channel core; and
a gate insulator between the gate and the channel core, the gate insulator completely surrounding the channel core, the gate insulator comprising two pairs of two diametrically opposed local regions extending radially through the gate insulator that individually extend along all of the minimum channel length at different circumferential locations relative to the channel core periphery, the two pairs having different collective capacitance along all of the minimum channel length, the gate insulator comprising only two of said pairs.

3. A field effect transistor construction comprising:
a semiconductive channel core;
a source/drain region at opposite ends of the channel core, the channel core comprising a minimum channel length there-through from an edge of one of the source/drain regions to an edge of the other source/drain region;
a gate proximate a periphery of the channel core;
a gate insulator between the gate and the channel core, the gate insulator having local regions radially there-through that individually extend along all of the minimum channel length and that have different capacitance at different circumferential locations along all of the minimum channel length relative to the channel core periphery; and
ferroelectric material radially inward of the gate and conductive material radially inward of the ferroelectric material, the ferroelectric material and the conductive material being radially outward of the gate insulator.

4. The construction of claim 3 wherein the gate insulator is devoid of ferroelectric material.

5. A field effect transistor construction, comprising:
a semiconductive channel core;
a source/drain region at opposite ends of the channel core, the channel core comprising a minimum channel length there-through from an edge of one of the source/drain regions to an edge of the other source/drain region;
a gate construction proximate a periphery of the channel core, the gate construction comprising:
  outer conductive material proximate the channel core periphery;
  outer ferroelectric material proximate the channel core periphery radially inward of the outer conductive material;
  inner conductive material proximate the channel core periphery radially inward of the outer ferroelectric material; and
  inner dielectric radially between the inner conductive material and the channel core, the inner dielectric having local regions radially there-through of different radial thickness that individually extend along all of the minimum channel length at different circumferential locations relative to the channel core periphery.

6. The construction of claim 5 wherein the local regions having different radial thicknesses have different capacitance relative one another.

* * * * *